(12) United States Patent
Verdoorn et al.

(10) Patent No.: US 6,791,352 B2
(45) Date of Patent: Sep. 14, 2004

(54) METHOD AND APPARATUS FOR DEBUGGING A CHIP

(75) Inventors: David Joel Verdoorn, Byron, MN (US); Sandra S. Woodward, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/072,103

(22) Filed: Feb. 8, 2002

(65) Prior Publication Data

US 2003/0155944 A1 Aug. 21, 2003

(51) Int. Cl.[7] .............................................. H03K 19/173
(52) U.S. Cl. ............................ 326/38; 326/16; 326/47; 327/407
(58) Field of Search ............................ 326/37–39, 41, 326/47, 101, 16; 327/407–408

(56) References Cited

U.S. PATENT DOCUMENTS

| | | | | |
|---|---|---|---|---|
| 5,455,525 A | * | 10/1995 | Ho et al. ........................ | 326/41 |
| 5,506,517 A | * | 4/1996 | Tsui et al. ..................... | 326/39 |
| 5,677,638 A | * | 10/1997 | Young et al. .................. | 326/39 |
| 5,760,602 A | * | 6/1998 | Tan .............................. | 326/38 |
| 6,483,343 B1 | * | 11/2002 | Faith et al. .................... | 326/40 |

OTHER PUBLICATIONS

Rhyne, Fundamental of Digital Systems Design, N.J., 1973, pp. 70–71.*

* cited by examiner

Primary Examiner—James H. Cho
(74) Attorney, Agent, or Firm—Dugan & Dugan

(57) ABSTRACT

In a first aspect, an apparatus is provided that is adapted to multiplex debug signals of an integrated circuit. The apparatus includes at least a first multiplexing circuit and a second multiplexing circuit. The first multiplexing circuit is adapted to receive first debug signals from the integrated circuit and to selectively multiplex at least a first portion of the first debug signals onto a first bus. The second multiplexing circuit is adapted to receive second debug signals from the integrated circuit and to selectively multiplex at least a first portion of the second debug signals onto a second bus. The apparatus further includes a logic circuit adapted to combine any debug signals of the first and second buses onto a third bus. An output stage of the apparatus is adapted to selectively output debug signals of the third bus. Numerous other aspects are provided, as are systems and methods.

3 Claims, 6 Drawing Sheets

METHOD AND APPARATUS FOR DEBUGGING A CHIP

FIELD OF THE INVENTION

The present invention relates to the design of semiconductor integrated circuits or "chips". In particular, the present invention relates to a method and apparatus for efficiently debugging chips during chip design.

BACKGROUND OF THE INVENTION

During the design of silicon based chips such as microprocessors, digital signal processors and the like, debugging procedures permit chip designers to verify the configuration and operation of a chip as well as to correct problems with the chip that may arise during the design process. Generally, a chip design includes a large number of Input/Output (I/O) ports which connect the chip to a processor board or a module for integration into an overall system. The number of I/O ports for a given chip design may be in the hundreds, although typically, only a small portion of the I/O ports are available for debugging the chip design. The limited number of I/O ports available for debugging makes the nature of chip design/debugging difficult, particularly when a chip design employs address buses, data buses and control signals that are spread across multiple clock domains.

Complex chip designs typically require the use of a myriad of debugging logic. Such debugging logic can represent a significant amount of a chip's hardware, and can consume a large amount of physical area and capacity of a chip. As a result, less hardware, physical area and capacity of the chip may be dedicated to the logic circuitry required to perform the chip's intended operations. For example, large multiplexers are often employed to multiplex debug signals over each of the limited number of debug I/O ports present in a chip design, resulting in processor redundancy and resource waste.

In view of the foregoing, it would be desirable to eliminate the redundancy resulting from multiplexing every debug I/O port. Moreover, it would be desirable to simplify debug logic circuitry such that less chip hardware, area and capacity are dedicated to debugging.

SUMMARY OF THE INVENTION

In accordance with a first aspect of the invention, an apparatus is provided that is adapted to multiplex debug signals of an integrated circuit. The apparatus includes at least a first multiplexing circuit and a second multiplexing circuit. The first multiplexing circuit is adapted to receive first debug signals from the integrated circuit and to selectively multiplex at least a first portion of the first debug signals onto a first bus. The second multiplexing circuit is adapted to receive second debug signals from the integrated circuit and to selectively multiplex at least a first portion of the second debug signals onto a second bus. The apparatus further includes a logic circuit adapted to combine any debug signals of the first bus and any debug signals of the second bus onto a third bus. An output stage of the apparatus is adapted to selectively output debug signals of the third bus.

In at least one embodiment of the invention, the output stage may include a third multiplexing circuit adapted to receive debug signals of the third bus and to selectively multiplex the debug signals onto a fourth bus. Numerous other aspects of the invention are provided, as are systems and methods for carrying out these and other aspects.

Other objects, features and advantages of the present invention will become more fully apparent from the following detailed description, the appended claims and the accompanying drawings.

DETAILED DESCRIPTION

Figure 1:
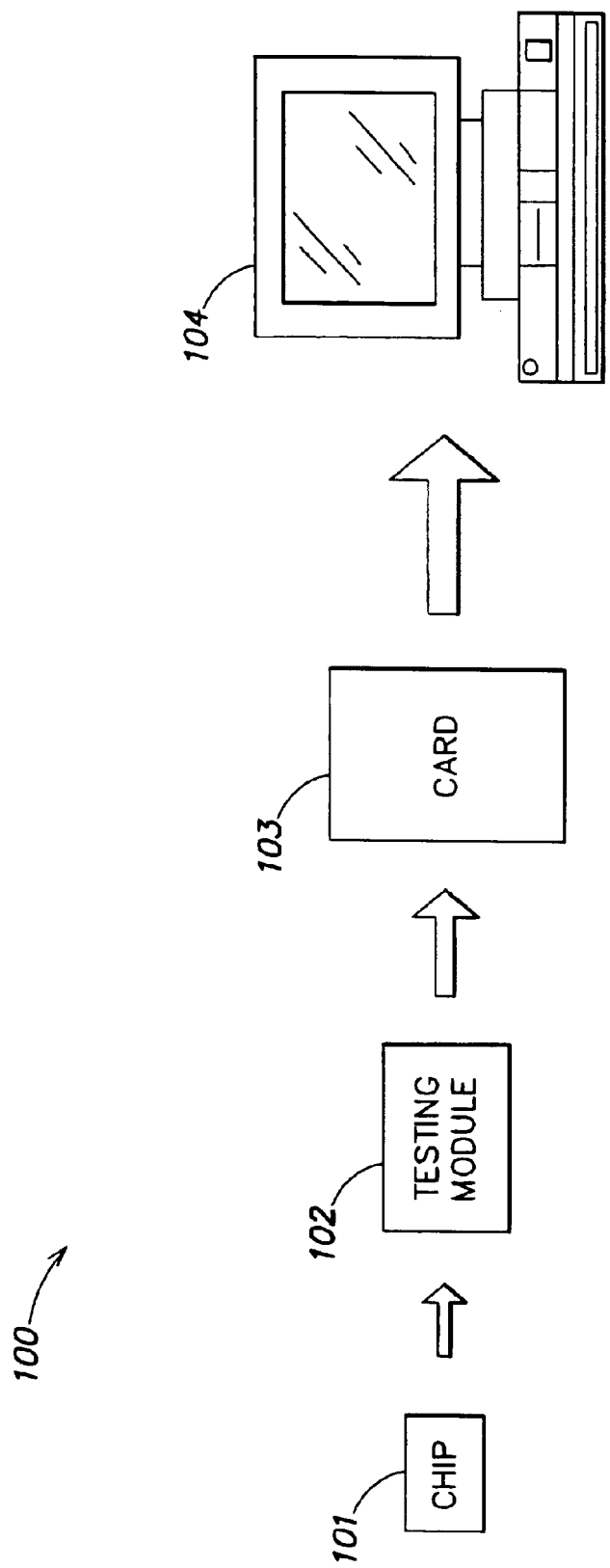
FIG. 1 is an overall system for debugging a chip in accordance with the present invention.

FIG. 1 illustrates an overall system 100 for debugging a chip in accordance with the present invention. Referring to FIG. 1, the system 100 includes a chip to be tested ("chip 101") coupled to a testing module 102 which is configured to connect to input/output (I/O) pins (not shown) of the chip 101 that are available for debugging ("debug I/O pins"). In the exemplary embodiment of the invention described herein, the chip 101 has 24 debug I/O pins (not shown) available to accommodate a 24 bit debug bus. Other numbers of debug I/O pins and/or debug bus widths may be employed.

The testing module 102 is coupled to a card 103 which connects the chip 101, via the testing module 102, to an interface terminal 104. The interface terminal 104 is configured to permit a user (e.g., a chip designer) to receive, display, and examine debug signals from the various debug I/O pins (not shown) of the chip 101. In this manner, the user may efficiently debug the chip 101 as described below.

Figure 2:
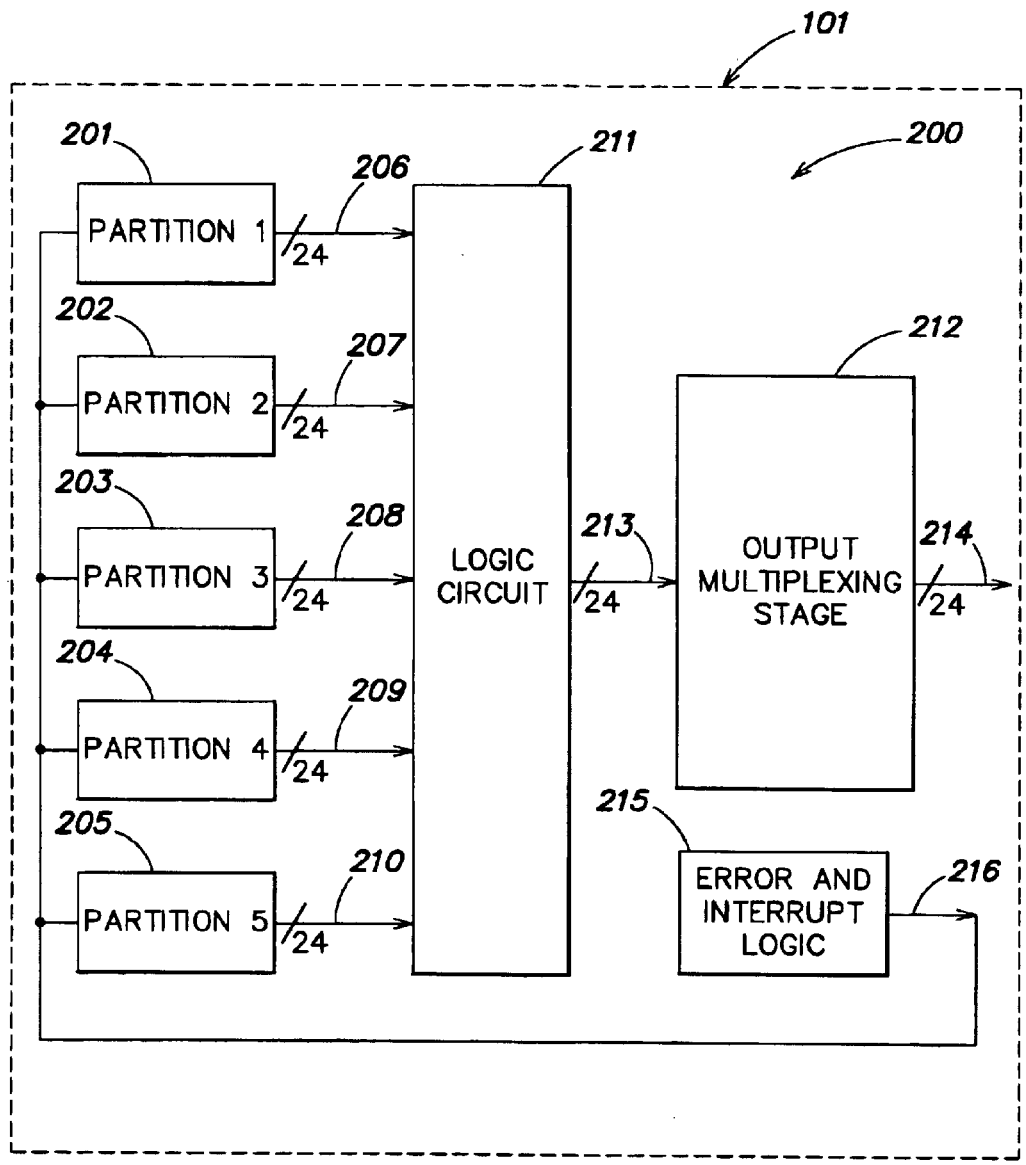
FIG. 2 is a block diagram of an exemplary debug multiplexing system of the chip of FIG. 1.

FIG. 2 is a block diagram of an exemplary debug multiplexing system 200 of the chip 101 configured in accordance with the present invention. With reference to FIG. 2, the debug multiplexing system 200 of the chip 101 includes a plurality of partitions 201–205, each of which multiplexes debug signals it receives from the chip 101 down to a 24 bit bus 206–210, respectively. Each 24 bit bus 206–210 is coupled to a logic circuit 211, which in the embodiment of FIG. 2 comprises a logic OR for performing a bit-by-bit OR operation upon signals output from each of the plurality of partitions 201–205. The logic circuit 211 is coupled to an output multiplexing stage 212 via a 24 bit bus 213. The output multiplexing stage 212 includes a 24 bit output debug bus 214 which corresponds to the 24 debug I/O pins of the chip 101.

As indicated above, the chip 101 may employ any number of debug I/O pins. Additionally, the chip 101 may include more or fewer than five partitions.

Depending on its design, the chip 101 may include signals operating in more than one clock domain (e.g., at more than one clock frequency). In one exemplary embodiment of the invention described below, the chip 101 employs three clock domains: 33 MHz, 50 MHz and 100 MHz. Fewer, more or other clock domains may be employed. The multiplexing of signals operating in multiple clock domains via the debug multiplexing system 200 is described below with reference to FIGS. 3–5.

With reference to FIG. 2, the debug multiplexing system 200 of the chip 101 also includes error and interrupt logic 215 which is adapted to combine various error and interrupt signals of the chip 101 so as to create a common error signal 216. The common error signal 216 is output to each of the partitions 201–205. Error and interrupt signals that may be fed to the error and interrupt logic 215 depend on the type of error and interrupt signals generated by the chip 101, but may include, for example, unexpected data errors or interrupts, unexpected address errors, timer interrupts, completion of function (without error) interrupts, completion of function (with error) interrupts, or the like.

In at least one embodiment of the invention, the error and interrupt logic 215 includes masking capabilities that allow an individual error or interrupt signal of the chip 101 to pass through the error and interrupt logic 215 as the common error signal 216. In this manner, the common error signal 216 may indicate that (1) a particular error or interrupt signal has been generated by the chip 101 (e.g., if all other error and interrupt signals fed to the error and interrupt logic 215 are masked); or (2) one or more error and/or interrupt signals have been generated by the chip 101 (e.g., if some or none of the error and interrupt signals fed to the error and interrupt logic 215 are masked). The error and interrupt logic 215 may comprise, for example, a suitable combination of multiplexers, control registers and/or OR logic (not shown).

As will be described further below with reference to FIGS. 3A–5, each partition 201–205 receives debug signals from one or more locations of the chip 101. The debug signals may be, for example, control signals, data signals, address signals or any other relevant signal employed and/or generated by the chip 101. The debug signals may be in one or more clock domains. A user (e.g., via the interface terminal 104), with knowledge of the particular debug signals received by each partition 201–205, may select which debug signals from which partition or partitions to output via the 24 bit output debug bus 214. For example, a user may direct the output of debug signals to the interface terminal 104 (via the 24 bit output debug bus 214) from only partition 201 by directing the partitions 202–205 to output only zeros on the buses 207–210. In this manner, debug signals from partition 201 will be output from the logic circuit 211 to the 24 bit bus 213, and subsequently output to the interface terminal 104 via the 24 bit output debug bus 214 by the output multiplexing stage 212. Likewise, two or more partitions 201–205 may output debug signals via the 24 bit output bus 214 by ensuring that the two or more partitions 201–205 only output debug signals on different bits of the 24 bit output debug bus 214 (as described further below).

Figure 3A:
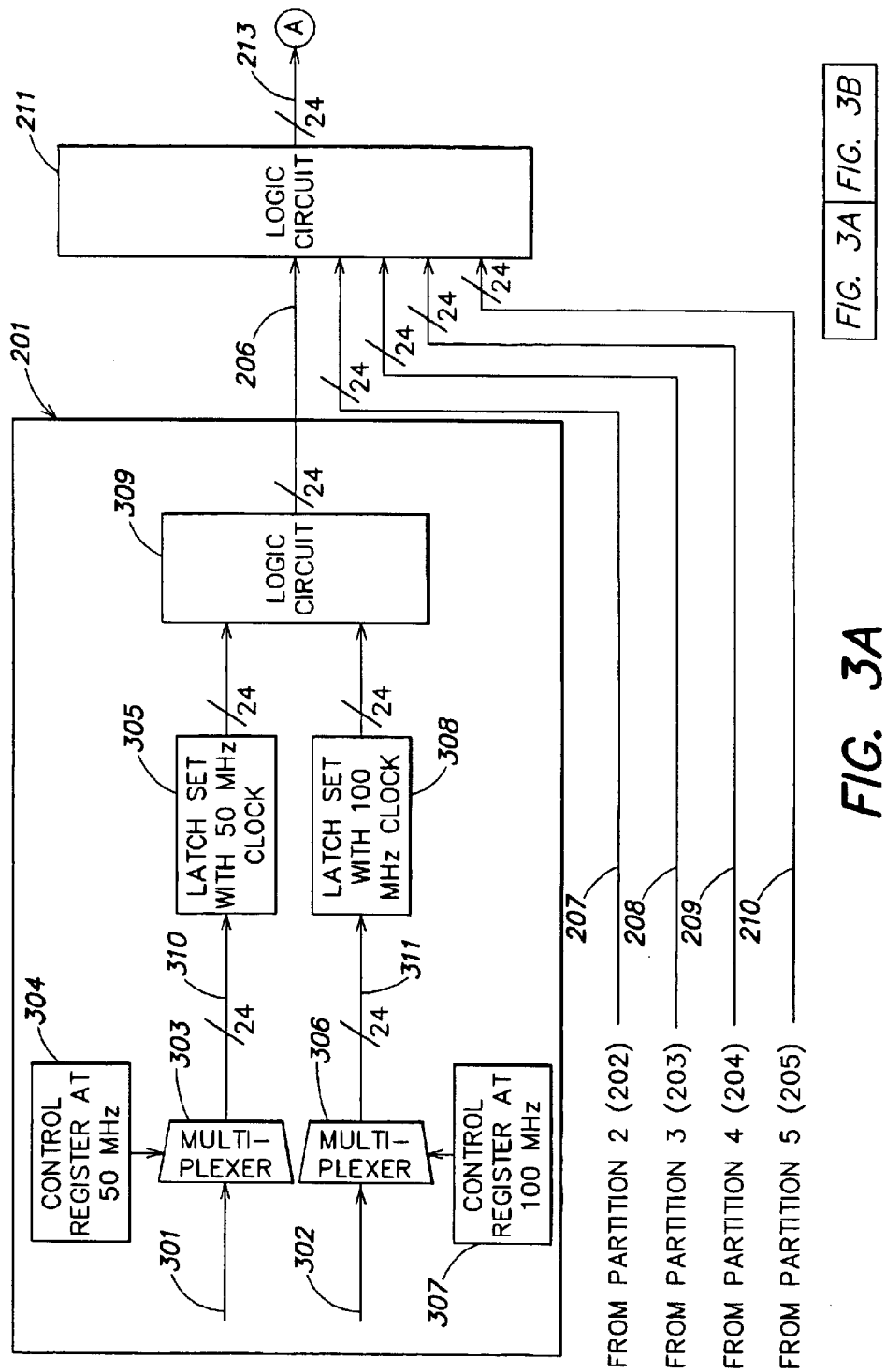
FIGS. 3A and 3B are a schematic diagram of an exemplary embodiment of the debug multiplexing system of FIG. 2.
Figure 3B:
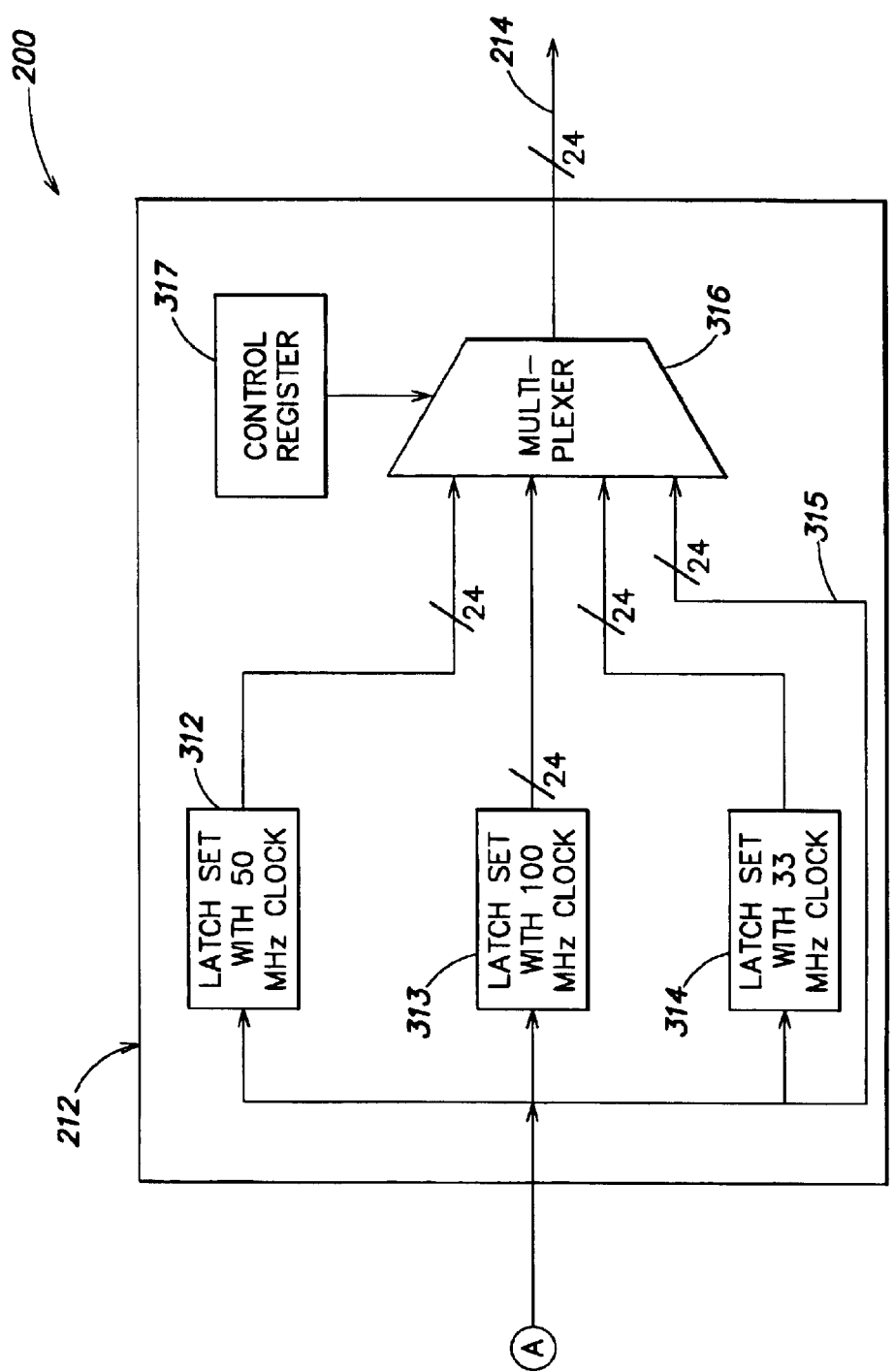

FIGS. 3A and 3B are a schematic diagram of an exemplary embodiment of the debug multiplexing system 200 of FIG. 2. For convenience, partitions 202–205 and the error and interrupt logic 215 are not shown. In the embodiment of FIGS. 3A–3B, the partition 201 receives debug signals in two clock domains, 50 MHz and 100 MHz, from the chip 101. With reference to FIGS. 3A–3B, the partition 201 includes a first multiplexer 303 configured to receive debug signals 301 operating in the 50 MHz clock domain. The first multiplexer 303 may be configured to receive any number of debug signals. The first multiplexer 303 is coupled to a first control register 304 and a first latch set 305. The partition 201 also includes a second multiplexer 306 configured to debug signals 302 operating in the 100 MHz clock domain. The second multiplexer 306 may be configured to receive any number of debug signals. The second multiplexer 306 is coupled to a second control register 307 and second latch set 308. Both of the latch sets 305, 308 are coupled to a logic circuit 309.

In the exemplary embodiment of FIGS. 3A–3B, the logic circuit 309 is configured to perform logic OR operations on the outputs of the latch sets 305, 308 on a bit-by-bit basis (thereby setting each bit of the 24 bit bus 206 of the partition 201). The first multiplexer 303 is a 24 bit multiplexer controlled on a 4 bit or "nibble" basis by the first control register 304; and the second multiplexer 306 is a 24 bit multiplexer controlled on a nibble basis by the second control register 307. The first latch set 305 includes 24 latches, one for each of the 24 bits output by the first multiplexer 303, clocked with a 50 MHz clock. The second latch set 308 also includes 24 latches, one for each of the 24 bits output by the second multiplexer 306, clocked with a 100 MHz clock. In this manner, debug signals for each clock domain (50 and 100 MHz) are handled separately within the partition 201, and multiplexed signals are clocked into separate latches with the corresponding clock from the respective clock domain. In at least one embodiment of the invention, the control registers 304, 307 comprise 32 bit registers, although other sizes may be employed.

Although the partition 201 is illustrated as receiving debug signals in two clock domains (e.g., the 50 MHz and 100 MHz clock domains), the partition 201, as well as the other partitions 202–205, may be configured to receive debug signals in more, fewer, and/or different clock domains within the scope of the invention. In addition, although the multiplexers 303, 306 have been illustrated as 24-bit multiplexers controlled on a nibble basis, the multiplexers 303, 306 may be other than 24-bit multiplexers, and may be controlled on other than a nibble basis within the scope of the invention.

Figure 4:
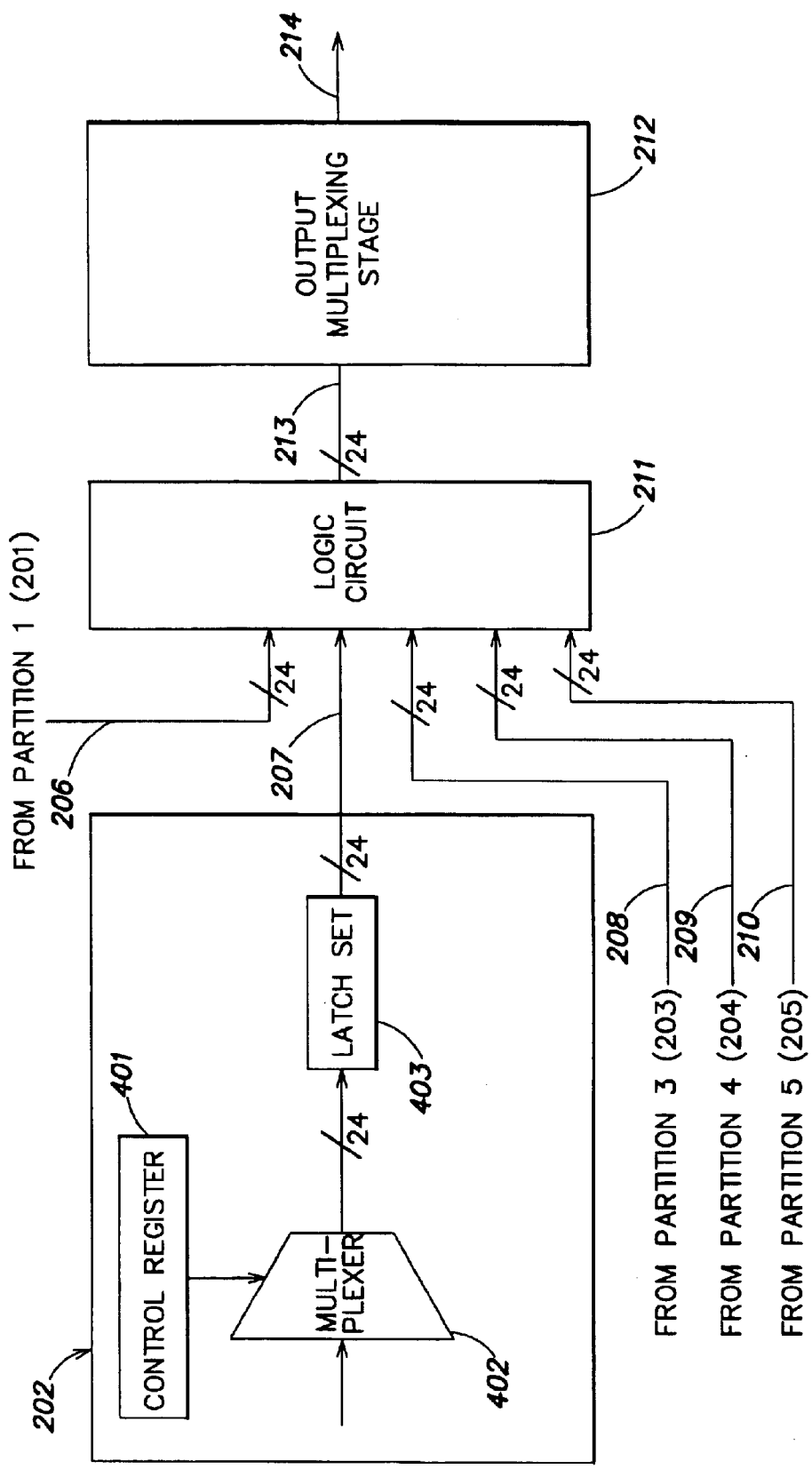
FIG. 4 illustrates an exemplary embodiment of a partition of the debug multiplexing system of FIG. 2 for receiving debug signals in only one clock domain.

Each of the other partitions 202–205 includes at least one control register and one multiplexer (not shown), and as will be discussed in further detail below, may or may not include a latch set. In addition, if one of the partitions 202–205 receives debug signals from the chip 101 that are in only one clock domain, then that particular partition 202–205 does not require a logic circuit (e.g., a logic OR circuit such as the logic circuit 309 which is employed to combine debug signals from multiple clock domains as described below). For example, FIG. 4 illustrates an exemplary embodiment of the partition 202 of FIG. 2 when the partition 202 receives debug signals from only one clock domain (e.g., 50 MHz). As shown in FIG. 4, the partition 202 includes a control register 401, a multiplexer 402, and a latch set 403, which operate similarly to control register 304, multiplexer 303, and latch set 305, respectively. Because the partition 202 receives debug signals from only one clock domain, the partition 202 does not employ an OR logic circuit.

Figure 5:
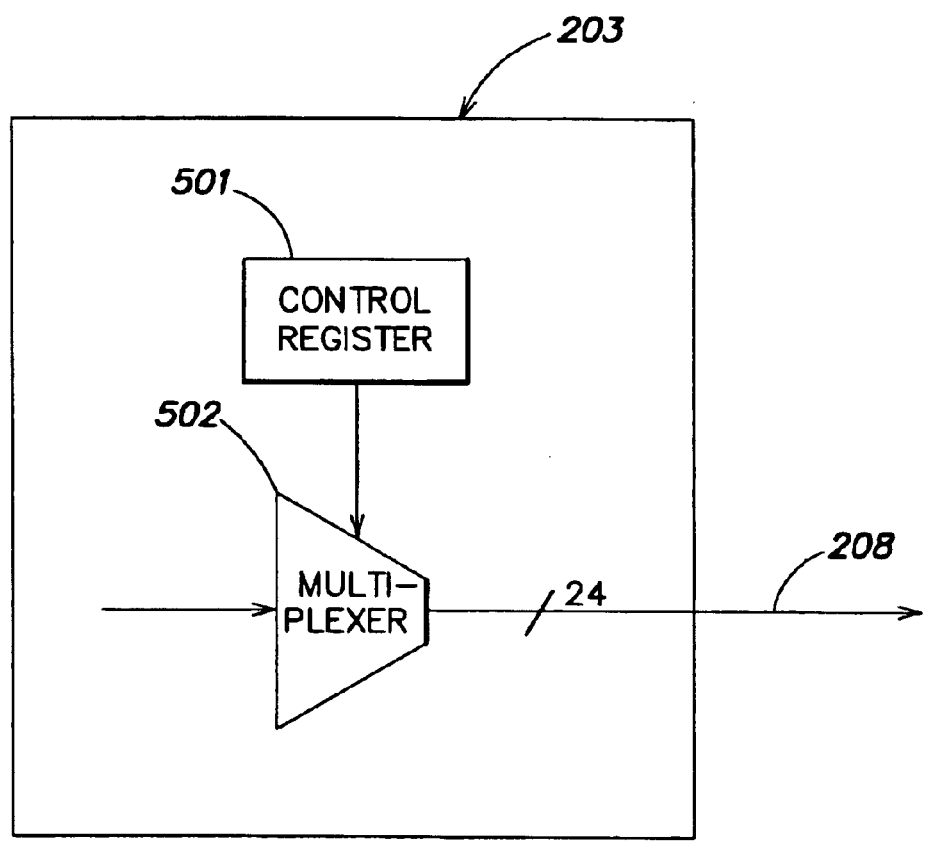
FIG. 5 illustrates an exemplary embodiment of a bypass signal partition of the debug multiplexing system of FIG. 2.

In the embodiment of FIGS. 3A–3B, the output multiplexing stage 212 includes a plurality of latch sets 312–314, each of which includes 24 latches clocked at 50 MHz, 100 MHz and 33 MHz, respectively. The output multiplexing stage 212 further includes a bypass bus 315 for debug signals that operate asynchronously (or at a frequency other than 50, 100 or 33 MHz). (If a partition receives only asynchronous debug signals (or debug signals at a frequency other than 50, 100 or 33 MHz), the partition need not employ a latch (e.g., because there is no suitable clock signal for latching the debug signals). For example, FIG. 5 illustrates an exemplary embodiment of the partition 203 of FIG. 2 when the partition 203 receives only asynchronous debug signals, or debug signals at a frequency other than 50, 100 or 33 MHz. As shown in FIG. 5, the partition 203 includes only a control register 501 and a multiplexer 502, which operate similarly to the control register 304 and the multiplexer 303 of FIG. 3A.) The output multiplexing stage 212 also includes a multiplexer 316 coupled to the latch sets 312–314 and the bypass bus 315, and a control register 317 coupled to the multiplexer 316.

In operation, each partition 201–205 multiplexes debug signals from the chip 101 down to a 24 bit bus 206–210 210, respectively, on a nibble (4 bit) basis. That is, under the direction of one or more control registers, each partition 201–205 outputs up to six nibbles (24 bits, nibbles 0–5) of debug signal information on a respective one of the 24 bit buses 206–210. Each nibble of each 24 bit bus 206–210 of the partitions 201–205 may be related or unrelated to other nibbles of the respective bus 206–210 (e.g., the nibbles of a bus may represent similar or dissimilar types of debug signals, debug signals operating in the same or different clock domains, etc.).

The logic circuit 211 performs a bit-by-bit OR operation to combine the contents of each 24 bit bus 206–210 of the partitions 201–205 into one 24 bit bus 213 (FIGS. 2–3B). For this reason, if all or a portion of a partition 201–205 is not selected (e.g., if a user does not wish to have a partition 201–205 output debug signals on all or a portion of its 24 bit bus 206–210), then the partition is configured to output zeros on the relevant (non-debug signal containing) bits of its 24 bit bus; so that the zeroed bits of the partition's 24 bit bus do not affect the corresponding bits of the 24 bit bus 213 of the logic circuit 211.

After the OR operation is performed by the logic circuit 211, the 24 bits of the 24 bit bus 213 are latched (with the exception of any bits corresponding to asynchronous debug signals or debug signals having a frequency that cannot be latched, such as a frequency other than 33, 50 or 100 MHz in the embodiment of FIGS. 3A–3B) and are multiplexed to form the 24 bit output debug bus 214. Any number (e.g., zero, one, two, three, four or five) of the partitions 201–205 may be selected to output debug signals to the output debug bus 214 (via appropriate control of one or more control registers of the respective partitions as described below).

As an example, assume that a user wishes to receive 24 debug signals via the output debug bus 214 wherein:

1. the first nibble, nibble 0, of debug signals to be output from the multiplexer 316 of the output multiplexing stage 212 is to comprise 50 MHz debug signals from partition 201;
2. the second nibble, nibble 1, of debug signals to be output from the multiplexer 316 of the output multiplexing stage 212 is to comprise 100 MHz debug signals from partition 201;
3. the third nibble, nibble 2, of debug signals to be output from the multiplexer 316 of the output multiplexing stage 212 is to comprise 50 MHz debug signals from partition 202;
4. the fourth nibble, nibble 3, of debug signals to be output from the multiplexer 316 of the output multiplexing stage 212 is to comprise asynchronous debug signals from partition 203;
5. the fifth nibble, nibble 4, of debug signals to be output from the multiplexer 316 of the output multiplexing stage 212 is to comprise 33 MHz debug signals from partition 204; and
6. the sixth nibble, nibble 5, of debug signals to be output from the multiplexer 316 of the output multiplexing stage 212 is to comprise 33 MHz debug signals from partition 204.

No debug signals are to be received from the partition 205. In this manner, the 24 bit output debug bus 214 will output 6 nibbles of debug signals from partitions 201–204.

To obtain the above described debug signals on the 24 bit output debug bus 214, the following steps are performed. Appropriate control bits are written (e.g., via the interface terminal 104 of FIG. 1) to the control register 304 of the partition 201 so as to cause debug signals received by the multiplexer 303 to pass through the multiplexer 303 as a first nibble (nibble 0) of the six nibbles (24 bits) output by the multiplexer 303. The remaining 20 bits (nibbles 1–5) output by the multiplexer 303 are all set to zeros. The six nibbles from the multiplexer 303 are output to a 24 bit bus 310, and then are latched via the latch set 305 (which operates at 50 MHz).

Likewise, appropriate control bits are written to the control register 307 of the partition 201 to cause debug signals received by the multiplexer 306 to pass through the multiplexer 306 as a second nibble (nibble 1) of the six nibbles (24 bits) output by the multiplexer 306. The remaining 20 bits (nibbles 0 and 2–5) output by the multiplexer 306 are all set to zeros. The six nibbles from the multiplexer 306 are output to a 24 bit bus 311, and then are latched via the latch set 308 (which operates at 100 MHz).

The six nibbles latched by the latch set 305 and the six nibbles latched by the latch set 308 are output to the logic circuit 309 where a bit-by-bit OR operation is performed thereon, such that six nibbles are output on the 24 bit bus 206 of the partition 201. The first of these six nibbles (nibble 0) represents the 50 MHz debug signals from the partition 201, and the second of these six nibbles (nibble 1) represents the 100 MHz debug signals from the partitions 201. The remaining nibbles (nibbles 2–5) output on the bus 206 of partition 201 are all zeros; and the six nibbles output on the bus 206 of partition 201 serve as a first input to the logic circuit 211.

Similar operations are performed with regard to the partitions 202–205. Specifically, with regard to the second partition 202, appropriate control bits are written to the control register 401 (FIG. 4) of the partition 202 to cause debug signals received by the multiplexer 402 to pass through the multiplexer 402 as a third nibble (nibble 2) of the six nibbles (24 bits) output by the multiplexer 402. The remaining 20 bits (nibbles 0–1 and 3–5) output by the multiplexer 402 are all set to zeros. The six nibbles output from the multiplexer 402 are latched via the latch set 403 (which operates at 50 MHz in this example), and are output on the 24 bit bus 207 of the partition 202. The six nibbles output on the bus 207 of partition 202 serve as a second input to the logic circuit 211.

Likewise, appropriate control bits are written to the control register 501 of the partition 203 to cause debug signals received by the multiplexer 502 to pass through the multiplexer 502 as a fourth nibble (nibble 3) of the six nibbles (24 bits) output by the multiplexer 502. The remaining 20 bits (nibbles 0–2 and 4–5) output by the multiplexer 502 are all set to zeros. The six nibbles output from the multiplexer 502 are output on the 24 bit bus 208 of the partition 203, and serve as a third input to the logic circuit 211.

Similar operations are performed with regard to the partitions 204–205 such that (1) the partition 204 outputs six nibbles onto the 24 bit bus 209 wherein the fifth and sixth nibbles (nibbles 4–5) represent 33 MHz debug signals and the remaining nibbles (nibbles 0–3) are all zeros; and (2) the partition 205 outputs six nibbles of zeros onto the 24 bit bus 210. The six nibbles output from the partition 204 serve as a fourth input to the logic circuit 211, and the six nibbles output from the partition 205 serve as a fifth input to the logic circuit 211.

The logic circuit 211 performs a bit-by-bit OR operation on the five sets of six nibbles provided by the partitions 201–205 so as to produce a single, six nibble output on the 24 bit bus 213. In the present example, the six nibbles include one nibble of 50 MHz debug signals from the partition 201 (nibble 0), one nibble of 100 MHz debug signals from the partition 201 (nibble 1), one nibble of 50 MHz debug signals from the partition 202 (nibble 2), one nibble of asynchronous debug signals from the partition 203 (nibble 3) and two nibbles of 33 MHz debug signals from the partition 204 (nibbles 4 and 5).

The six nibbles output to the bus 213 via the logic circuit 211 are processed by the output multiplexing stage 212 as follows. The 50 MHz debug signals of nibbles 0 and 2 are latched via the latch set 312 (which operates at 50 MHz), and serve as a first 24 bit input set to the multiplexer 316 (along with the other nibbles of the bus 213 that are also latched by the latch set 312). The 100 MHz debug signals of nibble 1 are latched via the latch set 313 (which operates at 100 MHz), and serve as a second 24 bit input set to the multiplexer 316 (along with the other nibbles of the bus 213 that are also latched by the latch set 313). The asynchronous bits of nibble 3 serve as a third 24 bit input set to the multiplexer 316 via the bypass path 315 (along with nibbles 0–2 and 4–5 of the 24 bit bus 213). The 33 MHz debug signals of nibbles 4 and 5 are latched via the latch set 314 and serve as a fourth 24 bit input set to the multiplexer 316 (along with the other nibbles of the bus 213 that are also latched by the latch set 314).

Appropriate control bits are written (e.g., via the interface terminal 104 of FIG. 1) to the control register 317 of the output multiplexing stage 212 to cause:

(1) 50 MHz debug signals from the partition 201 output by the latch set 312 to be output as nibble 0 of the output debug bus 214;

(2) 100 MHz debug signals from the partition 201 output by the latch set 313 to be output as nibble 1 of the output debug bus 214;

(3) 50 MHz debug signals from the partition 202 output by the latch set 312 to be output as nibble 2 of the output debug bus 214;

(4) asynchronous debug signals from the partition 203 present on the bus 213 to be output as nibble 3 of the output debug bus 214; and (5) 33 MHz debug signals from the partition 204 output by the latch set 314 to be output as nibbles 4 and 5 of the output debug bus 214.

Note that the latches 312–314 reduce/eliminate internal time problems associated with processing debug signals from multiple clock domains, and deliver a uniform timed debug bus (output debug bus 214) to the interface terminal 104. Other combinations and/or arrangements of debug signals from one or more of the partitions 201–205 may be similarly obtained.

In at least one embodiment of the invention, key control signals of the chip 101 are assigned to bits 0–7 (nibbles 0 and 1) of the output debug bus 214. Such key control signals generally include signals that provide information regarding the status of the other debug signals present on the output debug bus 214 (e.g., signals on bits 8–23 of the output debug bus 214), and allow a user to know when to observe the other debug signals. Exemplary key control signals include data bus error signals, valid address on address bus or data on data bus signals, acknowledgment signals (e.g., received address, data written, data read, read complete, etc.), or the like. In a similar manner, the common error signal 216 (FIG. 2) from the error and interrupt logic 215 may be employed to define when an error has occurred.

An example of a partition that employs bits 0–7 for key control signals is now provided. The exemplary partition is assumed to employ a 24 bit (six nibble) multiplexer controlled via a 32 bit control register on a nibble basis. Other multiplexer and/or control register configurations may be employed. The particular signals passed via each of the six nibbles of the partition's multiplexer are controlled by writing either a logic "1" or a logic "0" (via the interface terminal 104 of FIG. 1) to the appropriate bit or bits of the control register associated with the multiplexer as described below.

Table 1 provides an overview of which control bits of the control register control each nibble output by the multiplexer of the exemplary partition. As shown in Table 1, Bit 3 of the control register controls the signals passed by nibble 0 of the multiplexer. Bit 7 of the control register controls the signals passed by nibble 1 of the multiplexer. Bits 8–11 of the control register control the signals passed by nibble 2 of the multiplexer. Bits 12–15 of the control register control the signals passed by nibble 3 of the multiplexer. Bits 16–19 of the control register control the signals passed by nibble 4 of the multiplexer. Bits 20–23 of the control register control the signals passed by nibble 5 of the multiplexer. Other bits of the control register may be similarly employed to affect one or more bits output by the multiplexer. For example, in one embodiment of the invention, writing a logic "1" to bit 24 of the control register causes the common error signal 216 (FIG. 2) to be output from bit 23 of the multiplexer of the exemplary partition.

TABLE 1

| CONTROL REGISTER BIT# | AFFECT ON MULTIPLEXER OUTPUT |
|---|---|
| 3 | OUTPUT OF NIBBLE 0 |
| 7 | OUTPUT OF NIBBLE 1 |
| 8–11 | OUTPUT OF NIBBLE 2 |
| 12–15 | OUTPUT OF NIBBLE 3 |
| 16–19 | OUTPUT OF NIBBLE 4 |
| 20–23 | OUTPUT OF NIBBLE 5 |
| 24 | OUTPUT COMMON ERROR SIGNAL ON BIT 23 |
| 29–31 | ROTATE ORDER NIBBLES ARE OUTPUT FROM MULTIPLEXER |

Tables 2–8 illustrate how the state of each of the control register bits of Table 1 affect the output of the multiplexer of the exemplary partition. As described above and as shown in Tables 2–3, the first and second nibbles (nibbles 0 and 1) of the multiplexer are employed to pass key control signals of the chip 101. It will be understood that Tables 1–8 are merely exemplary, and that other configurations may be similarly employed.

TABLE 2

| STATE OF CONTROL REGISTER BIT#3 | NIBBLE 0 OUTPUT FROM MULTIPLEXER |
|---|---|
| 0 | ALL ZEROS |
| 1 | $1^{ST}$ SET OF KEY CONTROL SIGNALS |

TABLE 3

| STATE OF CONTROL REGISTER BIT#7 | NIBBLE 1 OUTPUT FROM MULTIPLEXER |
|---|---|
| 0 | ALL ZEROS |
| 1 | $2^{ND}$ SET OF KEY CONTROL SIGNALS |

TABLE 4

| STATE OF CONTROL REGISTER BITS#8–11 | NIBBLE 2 OUTPUT FROM MULTIPLEXER |
|---|---|
| 0000 | ALL ZEROS |
| 0001 | CONTROL SIGNALS |
| 0010 | ADDRESS BUS TRACE OF LINES 0–3 |
| 0011 | ADDRESS BUS TRACE OF LINES 16–19 |
| 0100 | WRITE BUS TRACE OF LINES 0–3 |
| 0101 | WRITE BUS TRACE OF LINES 16–19 |
| 0110 | WRITE BUS TRACE OF LINES 32–35 |
| 0111 | WRITE BUS TRACE OF LINES 48–51 |
| 1000 | READ BUS TRACE OF LINES 0–3 |
| 1001 | READ BUS TRACE OF LINES 16–19 |
| 1010 | READ BUS TRACE OF LINES 32–35 |
| 1011 | READ BUS TRACE OF LINES 48–51 |
| 1100 | $1^{ST}$ MISCELLANEOUS TRACE |
| 1101 | $2^{ND}$ MISCELLANEOUS TRACE |

TABLE 4-continued

| STATE OF CONTROL REGISTER BITS#8–11 | NIBBLE 2 OUTPUT FROM MULTIPLEXER |
|---|---|
| 1110 | 3$^{RD}$ MISCELLANEOUS TRACE |
| 1111 | 4$^{TH}$ MISCELLANEOUS TRACE |

TABLE 5

| STATE OF CONTROL REGISTER BITS#12–15 | NIBBLE 3 OUTPUT FROM MULTIPLEXER |
|---|---|
| 0000 | ALL ZEROS |
| 0001 | DEFAULT TRACE (E.G., MORE CONTROL OR SEQUENCER STATE BITS) |
| 0010 | ADDRESS BUS TRACE OF LINES 4–7 |
| 0011 | ADDRESS BUS TRACE OF LINES 20–23 |
| 0100 | WRITE BUS TRACE OF LINES 4–7 |
| 0101 | WRITE BUS TRACE OF LINES 20–23 |
| 0110 | WRITE BUS TRACE OF LINES 36–39 |
| 0111 | WRITE BUS TRACE OF LINES 52–55 |
| 1000 | READ BUS TRACE OF LINES 4–7 |
| 1001 | READ BUS TRACE OF LINES 20–23 |
| 1010 | READ BUS TRACE OF LINES 36–39 |
| 1011 | READ BUS TRACE OF LINES 52–55 |
| 1100 | 1$^{ST}$ MISCELLANEOUS TRACE |
| 1101 | 2$^{ND}$ MISCELLANEOUS TRACE |
| 1110 | 3$^{RD}$ MISCELLANEOUS TRACE |
| 1111 | 4$^{TH}$ MISCELLANEOUS TRACE |

TABLE 6

| STATE OF CONTROL REGISTER BITS#16–19 | NIBBLE 4 OUTPUT FROM MULTIPLEXER |
|---|---|
| 0000 | ALL ZEROS |
| 0001 | DEFAULT TRACE (E.G., MORE CONTROL OR SEQUENCER STATE BITS) |
| 0010 | ADDRESS BUS TRACE OF LINES 8–11 |
| 0011 | ADDRESS BUS TRACE OF LINES 24–27 |
| 0100 | WRITE BUS TRACE OF LINES 8–11 |
| 0101 | WRITE BUS TRACE OF LINES 24–27 |
| 0110 | WRITE BUS TRACE OF LINES 40–43 |
| 0111 | WRITE BUS TRACE OF LINES 56–59 |
| 1000 | READ BUS TRACE OF LINES 8–11 |
| 1001 | READ BUS TRACE OF LINES 24–27 |
| 1010 | READ BUS TRACE OF LINES 40–43 |
| 1011 | READ BUS TRACE OF LINES 56–59 |
| 1100 | 1$^{ST}$ MISCELLANEOUS TRACE |
| 1101 | 2$^{ND}$ MISCELLANEOUS TRACE |
| 1110 | 3$^{RD}$ MISCELLANEOUS TRACE |
| 1111 | 4$^{TH}$ MISCELLANEOUS TRACE |

TABLE 7

| STATE OF CONTROL REGISTER BITS#20–23 | NIBBLE 5 OUTPUT FROM MULTIPLEXER |
|---|---|
| 0000 | ALL ZEROS |
| 0001 | DEFAULT TRACE (E.G., MORE CONTROL OR SEQUENCER STATE BITS) |
| 0010 | ADDRESS BUS TRACE OF LINES 12–15 |
| 0011 | ADDRESS BUS TRACE OF LINES 28–31 |
| 0100 | WRITE BUS TRACE OF LINES 12–15 |
| 0101 | WRITE BUS TRACE OF LINES 28–31 |
| 0110 | WRITE BUS TRACE OF LINES 44–47 |
| 0111 | WRITE BUS TRACE OF LINES 60–63 |
| 1000 | READ BUS TRACE OF LINES 12–15 |
| 1001 | READ BUS TRACE OF LINES 28–31 |
| 1010 | READ BUS TRACE OF LINES 44–47 |
| 1011 | READ BUS TRACE OF LINES 60–63 |
| 1100 | 1$^{ST}$ MISCELLANEOUS TRACE |
| 1101 | 2$^{ND}$ MISCELLANEOUS TRACE |

TABLE 7-continued

| STATE OF CONTROL REGISTER BITS#20–23 | NIBBLE 5 OUTPUT FROM MULTIPLEXER |
|---|---|
| 1110 | 3$^{RD}$ MISCELLANEOUS TRACE |
| 1111 | 4$^{TH}$ MISCELLANEOUS TRACE |

TABLE 8

| STATE OF CONTROL REGISTER BITS#29–31 | ORDER NIBBLES OF MULTIPLEXER ARE OUTPUT ON OUTPUT DEBUG BUS 214 |
|---|---|
| 000 | NIBBLES 0–5 (NO ROTATE) |
| 001 | NIBBLES 1–5; NIBBLE 0 (ROTATE LEFT 1) |
| 010 | NIBBLES 2–5; NIBBLES 0–1 (ROTATE LEFT 2) |
| 011 | NIBBLES 3–5; NIBBLES 0–2 (ROTATE LEFT 3) |
| 100 | NIBBLES 4–5; NIBBLES 0–3 (ROTATE LEFT 4) |
| 101 | NIBBLE 5; NIBBLES 0–4 (ROTATE LEFT 5) |

The foregoing description discloses only exemplary embodiment of the invention; modifications of the above disclosed apparatus and methods which fall within the scope of the invention will be readily apparent to those of ordinary skill in the art. For example, other numbers of partitions and/or clock domains may be employed, as may other sizes of multiplexers, control registers and/or bus widths. The particular control register bit assignments described above are merely exemplary. Other control register bit assignments may be employed.

While the present invention has been disclosed in connection with exemplary embodiments thereof, it will be understood that other embodiments may fall within the spirit and scope of the invention, as defined by the following claims.

The Invention claimed is:

1. An apparatus adapted to multiplex debug signals of an integrated circuit, the apparatus comprising:
    at least a first multiplexing circuit and a second multiplexing circuit, wherein:
        the first multiplexing circuit is adapted to receive first debug signals from the integrated circuit and to selectively multiplex at least a first portion of the first debug signals onto a first bus;
        the first multiplexing circuit is part of a first partition of the integrated circuit adapted to selectively multiplex the first debug signals of the integrated circuit;
        the first multiplexing circuit comprises a first multiplexer adapted to receive the first debug signals from the integrated circuit and to selectively multiplex at least the first portion of the first debug signals and a first control register coupled to the first multiplexer and adapted to control multiplexing of the first debug signals by the first multiplexer;
        the second multiplexing circuit is adapted to receive second debug signals from the integrated circuit and to selectively multiplex at least a first portion of the second debug signals onto a second bus;
        the second multiplexing circuit is part of a second partition of the integrated circuit adapted to selectively multiplex the second debug signals; and
        the second multiplexing circuit comprises a second multiplexer adapted to receive the second debug signals from the integrated circuit and to selectively multiplex at least the first portion of the second debug signals and a second control register coupled to the second multiplexer and adapted to control multiplexing of the second debug signals by the second multiplexer;

a logic circuit adapted to combine any debug signals of the first bus and any debug signals of the second bus onto a third bus;

an output stage adapted to selectively output debug signals of the third bus;

a first latch set coupled to the first multiplexer and adapted to latch debug signals output by the first multiplexer at a first clock frequency; and a second latch set coupled to the second multiplexer and adapted to latch debug signals output by the second multiplexer at a second clock frequency.

2. An apparatus adapted to multiplex debug signals of an integrated circuit, the apparatus comprising:

at least a first multiplexing circuit and a second multiplexing circuit, wherein:

the first and second multiplexing circuits are part of a single partition of the integrated circuit adapted to selectively multiplex the first and second debug signals;

the first multiplexing circuit is adapted to receive first debug signals from the integrated circuit and to selectively multiplex at least a first portion of the first debug signals onto a first bus;

the first multiplexing circuit comprises a first multiplexer adapted to receive the first debug signals from the integrated circuit and to selectively multiplex at least the first portion of the first debug signals and a first control register coupled to the first multiplexer and adapted to control multiplexing of the first debug signals by the first multiplexer;

the second multiplexing circuit is adapted to receive second debug signals from the integrated circuit and to selectively multiplex at least a first portion of the second debug signals onto a second bus; and the second multiplexing circuit comprises a second multiplexer adapted to receive the second debug signals from the integrated circuit and to selectively multiplex at least the first portion of the second debug signals and a second control register coupled to the second multiplexer and adapted to control multiplexing of the second debug signals by the second multiplexer;

a logic circuit adapted to combine any debug signals of the first bus and any debug signals of the second bus onto a third bus;

an output stage adapted to selectively output debug signals of the third bus;

a first latch set coupled to the first multiplexer and adapted to latch debug signals output by the first multiplexer at a first clock frequency; and a second latch set coupled to the second multiplexer and adapted to latch debug signals output by the second multiplexer at a second clock frequency.

3. A method of multiplexing debug signals of an integrated circuit, the method comprising:

receiving first debug signals from the integrated circuit;

selectively multiplexing at least a first portion of the first debug signals onto a first bus, wherein selectively multiplexing at least the first portion of the first debug signals onto the first bus is performed by a first partition of the integrated circuit;

latching the first portion of the first debug signals at a first clock frequency following multiplexing of the first portion of the first debug signals;

receiving second debug signals from the integrated circuit;

selectively multiplexing at least a first portion of the second debug signals onto a second bus, wherein selectively multiplexing at least the first portion of the second debug signals onto the second bus is performed by a second partition of the integrated circuit;

latching the first portion of the second debug signals at a second clock frequency following multiplexing of the first portion of the second debug signals;

combining any debug signals of the first and second buses onto a third bus; and selectively outputting debug signals of the third bus.

* * * * *